US006177151B1

(12) United States Patent
Chrisey et al.

(10) Patent No.: US 6,177,151 B1
(45) Date of Patent: Jan. 23, 2001

(54) MATRIX ASSISTED PULSED LASER EVAPORATION DIRECT WRITE

(75) Inventors: Douglas B. Chrisey, Bowie, MD (US); R. Andrew McGill, Lorton, VA (US); Alberto Pique, Bowie, MD (US)

(73) Assignee: The United States of America as represented by the Secretary of the Navy, Washington, DC (US)

( * ) Notice: Under 35 U.S.C. 154(b), the term of this patent shall be extended for 0 days.

(21) Appl. No.: 09/318,134

(22) Filed: May 25, 1999

Related U.S. Application Data
(60) Provisional application No. 60/117,488, filed on Jan. 27, 1999.

(51) Int. Cl.[7] .............................. B23K 26/00; C23C 14/00
(52) U.S. Cl. ....................... 427/596; 427/561; 219/121.85
(58) Field of Search .................................. 427/561, 596, 427/597, 555; 219/121.85

(56) References Cited

U.S. PATENT DOCUMENTS

| | | | |
|---|---|---|---|
| 3,745,586 | 7/1973 | Braudy | 346/76 |
| 3,978,247 | 8/1976 | Braudy et al. | 427/43 |
| 4,064,205 | * 12/1977 | Landsman | 264/25 |
| 4,245,003 | 1/1981 | Oransky et al. | 428/323 |
| 4,702,958 | * 10/1987 | Itoh et al. | 428/323 |
| 4,752,455 | 6/1988 | Mayer | 427/53.1 |
| 4,895,735 | 1/1990 | Cook | 427/43.1 |
| 4,970,196 | 11/1990 | Kim et al. | 505/1 |

(List continued on next page.)

FOREIGN PATENT DOCUMENTS

| | | |
|---|---|---|
| 2113336 | * 9/1971 | (DE) . |
| WO 95/13195 | * 5/1995 | (WO) . |

OTHER PUBLICATIONS

McGill et al, "Choosing Polymer Coatings for Chemical Sensors", *Chemtech*, vol. 24, No. 9, pp. 27–37, Sep. 1994.*

*IBM Tech. Disc. Bull.* "Enchancing ribbon transfer using Laser Printing", vol. 17, No. 6, p. 1807–1808, Nov. 1974.*

Tolbert et al, "Laser Ablation Transfer Imaging Using Picosecond Optical pulses: Ultra–High Speed, Lower Threshold and High Resolution" Journal of Imaging Science and Technology, vol. 37, No. 5, Sep./Oct. 1993pp.485–489.

Adrian et al, "A Study of the Mechanism of Metal Deposition by the Laser–Induced Forward Transfer Process" J. Vac. Sci. Technol. B5 (5), Sep./Oct. 1987, pp. 1490–1494.

Bohandy et al, Metal Deposition from a Supported Metal Film Using an Excimer Laser, J. Appl. Phys. 60 (4) Aug. 15, 1986, pp. 1538–1539.

*Primary Examiner*—Marianne Padgett
(74) *Attorney, Agent, or Firm*—John J. Karasek; Philip E. Ketner (57) ABSTRACT

An device for depositing a transfer material onto a receiving substrate includes a source of pulsed laser energy, a receiving substrate, and a target substrate. The target substrate comprises a laser transparent support having a back surface and a front surface. The front surface has a coating that comprises a mixture of the transfer material to be deposited and a matrix material. The matrix material is a material that has the property that, when it is exposed to pulsed laser energy, it is more volatile than the transfer material. The source of pulsed laser energy is be positioned in relation to the target substrate so that pulsed laser energy is directed through the back surface of the target substrate and through the laser-transparent support to strike the coating at a defined location with sufficient energy to volatilize the matrix material at the location, causing the coating to desorb from the location and be lifted from the surface of the support. The receiving substrate is positioned in a spaced relation to the target substrate so that the transfer material in the desorbed coating can be deposited at a defined location on the receiving substrate.

35 Claims, 1 Drawing Sheet

U.S. PATENT DOCUMENTS

| | | | |
|---|---|---|---|
| 4,987,006 | 1/1991 | Williams et al. | 427/53.1 |
| 5,156,938 | 10/1992 | Foley et al. | 430/200 |
| 5,171,650 | 12/1992 | Ellis et al. | 430/20 |
| 5,173,441 | 12/1992 | Yu et al. | 437/173 |
| 5,256,506 | 10/1993 | Ellis et al. | 430/20 |
| 5,292,559 | 3/1994 | Joyce, Jr. et al. | 427/597 |
| 5,308,737 * | 5/1994 | Bills et al. | 430/201 |
| 5,492,861 | 2/1996 | Opower | 437/173 |
| 5,567,336 * | 10/1996 | Tatah | 427/597 |
| 5,725,706 | 3/1998 | Thoma et al. | 156/150 |
| 5,725,914 | 3/1998 | Opower | 427/592 |
| 5,736,464 | 4/1998 | Opower | 438/707 |
| 6,060,127 * | 5/2000 | Tatah et al. | 427/596 |

* cited by examiner

MATRIX ASSISTED PULSED LASER EVAPORATION DIRECT WRITE

This application claims benefit to Provisional application Ser. No. 06/117,488, filed Jan. 27, 1999.

BACKGROUND OF THE INVENTION

1. Field of the Invention

The invention relates generally to the deposition of materials and more specifically to devices, materials and methods for direct writing of a wide range of different materials onto substrates.

2. Description of the Related Art

The term "direct write" refers generally to any technique for creating a pattern directly on a substrate, either by adding or removing material from the substrate, without the use of a mask or preexisting form. Direct write technologies have been developed in response to a need in the electronics industry for a means to rapidly prototype passive circuit elements on various substrates, especially in the mesoscopic regime, that is, electronic devices that straddle the size range between conventional microelectronics (sub-micron-range) and traditional surface mount components (10+ mm-range). (Direct writing may also be accomplished in the sub-micron range using electron beams or focused ion beams, but these techniques, because of their small scale, are not appropriate for large scale rapid prototyping.) Direct writing allows for circuits to be prototyped without iterations in photolithographic mask design and allows the rapid evaluation of the performance of circuits too difficult to accurately model. Further, direct writing allows for the size of printed circuit boards and other structures to be reduced by allowing passive circuit elements to be conformably incorporated into the structure. Direct writing can be controlled with CAD/CAM programs, thereby allowing electronic circuits to be fabricated by machinery operated by unskilled personnel or allowing designers to move quickly from a design to a working prototype. Mesoscopic direct write technologies have the potential to enable new capabilities to produce next generation applications in the mesoscopic regime. Other applications of direct write technologies in microelectronic fabrication include forming ohmic contacts, forming interconnects for circuit and photolithographic mask repair, device restructuring and customization, design and fault correction.

Currently known direct write technologies for adding materials to a substrate include ink jet printing, Micropen©, laser chemical vapor deposition (LCVD) and laser engineered nano-shaping (LENS). Currently known direct write technologies for removing material from a substrate include laser machining, laser trimming and laser drilling.

The direct writing techniques of ink jet printing, screening and Micropen© are wet techniques, that is, the material to be deposited is combined with a solvent or binder and is squirted onto a substrate. The solvent or binder must later be removed by a drying or curing process, which limits the flexibility and capability of these approaches. In addition, wet techniques are inherently limited by viscoelastic properties of the fluid in which the particles are suspended or dissolved.

In the direct writing technique known as "laser induced forward transfer" (LIFT), a pulsed laser beam is directed through a laser-transparent target substrate to strike a film of material coated on the opposite side of the target substrate. The laser vaporizes the film material as it absorbs the laser radiation and, due to the transfer of momentum, the material is removed from the target substrate and is redeposited on a receiving substrate that is placed in proximity to the target substrate. Laser induced forward transfer is typically used to transfer opaque thin films, typically metals, from a pre-coated laser transparent support, typically glass, $SiO_2$, $Al_2O_3$, $SrTiO_3$, etc., to the receiving substrate. Various methods of laser-induced forward transfer are described in, for example, the following U.S. patents and publications incorporated herein by reference: U.S. Pat. No. 4,752,455 to Mayer, U.S. Pat. No. 4,895,735 to Cook, U.S. Pat. No. 5,725,706 to Thoma et al, U.S. Pat. No. 5,292,559 to Joyce, Jr. et al, U.S. Pat. No. 5,492,861 to Opower, U.S. Pat. No. 5,725,914 to Opower, U.S. Pat. No. 5,736,464 to Opower, U.S. Pat. No. 4,970,196 to Kim et al, U.S. Pat. No. 5,173,441 to Yu et al, and Bohandy et al, "Metal Deposition from a Supported Metal Film Using an Excimer Laser, J. Appl. Phys. 60 (4) Aug. 15, 1986, pp 1538–1539. Because the film material is vaporized by the action of the laser, laser induced forward transfer is inherently a homogeneous, pyrolytic technique and typically cannot be used to deposit complex crystalline, multi-component materials or materials that have a crystallization temperature well above room temperature because the resulting deposited material will be a weakly adherent amorphous coating. Moreover, because the material to be transferred is vaporized, it becomes more reactive and can more easily become degraded, oxidized or contaminated. The method is not well suited for the transfer of organic materials, since many organic materials are fragile and thermally labile and can be irreversibly damaged during deposition. Moreover, functional groups on an organic polymer can be irreversibly damaged by direct exposure to laser energy. Other disadvantages of the laser induced forward transfer technique include poor uniformity, morphology, adhesion, and resolution. Further, because of the high temperatures involved in the process, there is a danger of ablation or sputtering of the support, which can cause the incorporation of impurities in the material that is deposited on the receiving substrate. Another disadvantage of laser induced forward transfer is that it typically requires that the coating of the material to be transferred be a thin coating, generally less that 1 $\mu$m thick. Because of this requirement, it is very time-consuming to transfer more than very small amounts of material.

In a simple variation of the laser induced forward deposition technique, the target substrate is coated with several layers of materials. The outermost layer, that is, the layer closest to the receiving substrate, consists of the material to be deposited and the innermost layer consists of a material that absorbs laser energy and becomes vaporized, causing the outermost layer to be propelled against the receiving substrate. Variations of this technique are described in, for example, the following U.S. patents and publications incorporated herein by reference: U.S. Pat. No. 5,171,650 to Ellis et al, U.S. Pat. No. 5,256,506 to Ellis et al, U.S. Pat. No. 4,987,006 to Williams et al, U.S. Pat. No. 5,156,938 to Foley et al and Tolbert et al, "Laser Ablation Transfer Imaging Using Picosecond Optical pulses: Ultra-High Speed, Lower Threshold and High Resolution" Journal of imaging Science and Technology, Vol.37, No.5, Sept./Oct. 1993pp.485–489. A disadvantage of this method is that, because of the multiple layers, it is difficult or impossible to achieve the high degree of homogeneity of deposited material on the receiving substrate required, for example, for the construction of electronic devices, sensing devices or passivation coatings.

Therefore, there is a strong need for devices and methods for transferring materials for uses such as in electronic devices, sensing devices or passivation coatings with in such a way that desired properties of the materials are preserved or enhanced. For example, there is a need for a method to transfer powders or particulate materials so that they retain their bulk properties. With respect to novel materials such as organic polymers that are incorporated into electronic devices, there is a need for a method to transfer these materials in such a way that their structural and chemical integrity is retained.

SUMMARY OF THE INVENTION

It is an object of the present invention to provide devices, materials and methods for depositing a material on a substrate wherein a pattern can be created directly on the substrate without the use of a mask.

It is an object of the present invention to provide a device and method that is useful for depositing a wide range of materials such as complex polymeric materials or complex electronic materials, with no damage to the starting material.

It is a further object of the present invention to provide a device and method for depositing a material on a substrate wherein the deposition can be carried out in ambient conditions, that is, at atmospheric pressure and at room temperature.

It is a further object of the present invention to provide a device ad method for depositing a material on a substrate by laser induced deposition wherein the spatial resolution of the deposited material can be as small as 1 $\mu$m.

It is an object of the present invention to provide equipment and a method for creating an electronic device, sensor, or passivation coating by depositing a materials on a substrate in a controlled manner wherein the process can be computer-controlled.

It is an object of the present invention to provide equipment and a method for creating an electronic device, sensor or passivation coating by depositing a materials on a substrate in a controlled manner wherein it is possible to switch rapidly between different materials to be deposited on the substrate.

These and other objects are achieved by a device and method for depositing a material onto a receiving substrate, the device comprising a source of pulsed laser energy, a receiving substrate, and a target substrate. The target substrate comprises a laser transparent support having a back surface and a front surface. The front surface has a coating that comprises a mixture of the transfer material to be deposited and a matrix material. The matrix material has the property that, when it is exposed to pulsed laser energy, it is more volatile than the transfer material. The source of pulsed laser energy can be positioned in relation to the target substrate so that pulsed laser energy can be directed through the back surface of the target substrate and through the laser-transparent support to strike the coating at a defined location with sufficient energy to volatilize the matrix material at the location, causing the coating to desorb from the location and be lifted from the surface of the support. The receiving substrate can be positioned in a spaced relation to the target substrate so that the transfer material in the desorbed coating can be deposited at a defined location on the receiving substrate and so that the matrix material, or decomposition products thereof, in the desorbed coating can migrate from the space between the receiving substrate and the target substrate.

The source of pulsed laser energy and the target substrate can be moved with respect to each other so that after the coating desorbs at one location on the target substrate, the pulsed laser energy can be directed to another location on the target substrate where the coating has not yet desorbed. The source of pulsed laser energy and the receiving substrate can be moved with respect to each other so that the transfer material can be deposited in a pattern. The source of pulsed laser energy can also be directed through a transparent region of the target substrate, or the target substrate can be moved completely out of the way so that the pulsed laser energy strikes the receiving substrate it directly and interacts with the receiving substrate or with material already deposited on the receiving substrate. This can be done, for example, to roughen the surface of the receiving substrate or to modify the composition and properties of material that has been deposited.

BRIEF DESCRIPTION OF THE DRAWINGS

A more complete appreciation of the invention will be readily obtained by reference to the following Description of the preferred Embodiments and the accompanying drawings.

DETAILED DESCRIPTION OF THE PREFERRED EMBODIMENTS

Figure 1:
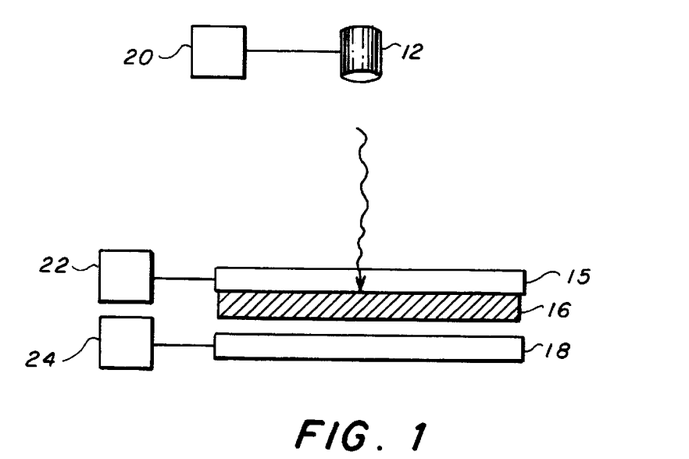
FIG. 1 is a schematic representation of the apparatus of the present invention.
Figure 2A:
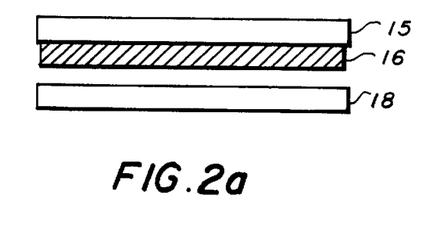
FIGS. 2*a* and 2*b* are schematic representations of the laser transparent substrate, the coating and the receiving substrate before (2*a*) and after (2*b*) the depositing of the transfer material on the receiving substrate.
Figure 2B:
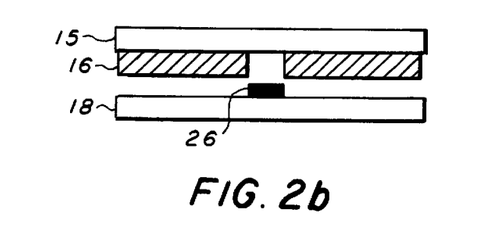

As schematically illustrated in FIG. 1, the apparatus of the present invention includes a pulsed laser 12 that emits pulsed laser energy as depicted by arrow 14. The pulsed laser is positioned so that laser pulses travel through the back surface of the target substrate and through the laser transparent support 15 to strike the coating 16, which comprises a mixture of a transfer material and a matrix material. The receiving substrate 18 is positioned so that when the coating desorbs from the target substrate, the transfer material is deposited on the receiving substrate. The laser, the target substrate and the receiving substrate are connected to laser positioning means 20, target substrate positioning means 22 and receiving substrate positioning means 24, respectively. FIGS. 2*a* and 2*b* schematically illustrate the effects of exposing the coating 16 to the pulsed laser energy 14, whereby the coating 16 desorbs from the surface of the target substrate so that the transfer material 26 is deposited onto the receiving substrate 18.

The receiving substrate can be any material, planar or non-planar onto which one may wish to deposit a transfer material. The receiving substrate may be any solid material including, but not limited to, silicon, glass, plastics, metals, and ceramics. The present invention is particularly useful in creating electronic devices such as passive and active components of printed circuit boards (PCBs) or in creating chemoselective coatings for chemical sensors such as surface acoustic wave (SAW) resonators.

The transfer material can be any material that one may wish to deposit on a substrate in a defined pattern, including, but not limited to the following:

Metals, including, but not limited to silver, nickel, gold, copper, chromium, titanium, aluminum, platinum, palladium, etc., and alloys thereof;

Ceramics, including, but not limited to alumina ($Al_2O_3$), silica and other glasses, and dielectrics (see below);

Dielectrics, including, but not limited to alumina, magnesium oxide (MgO), yttrium oxide($Y_2O_3$), zirconium oxide ($ZrO_2$), cerium oxide ($CeO_2$), etc.;

Ferroelectrics, including, but not limited to barium titanate ($BaTiO_3$), strontium titanate ($SrTiO_3$), lead titanate ($PbTiO_3$), lead zirconate ($PbZrO_3$), potassium niobate ($KNbO_3$), strontium bismuth tantalate ($SrBi_2Ta_2O_9$), (Ba, Sr)$TiO_3$, and solid solution stoichiometric variations thereof, etc.;

Piezoelectrics, including, but not limited to the above mentioned ferroelectrics, quartz, AlN, etc.;

Ferrites, including but not limited to yttrium iron garnet ($Y_3Fe_5O_{12}$), barium zinc ferrite ($Ba_2Zn_2Fe_{12}O_{19}$), hexagonal ferrites such as barium ferrite, spinel ferrites such as nickel zinc ferrites, manganese zinc ferrite, magnetite ($Fe_3O_4$), etc.;

Electro-optical ceramics, including, but not limited to lithium niobate ($LiNbO_3$), lithium tantalate ($LiTaO_3$), cadmiun telluride (CdTe), zinc sulfide (ZnS), etc.;

Ceramic superconductors, including, but not limited to $YBa_2Cu_3O_{7-x}$ (YBCO), $Tl_2CaBa_2Cu_3O_{12}$, $La_{1.4}Sr_{0.6}CuO_{3.1}$, BiSrCACuO, BaKBiO, halide doped fullerines, etc.;

Chalcogenides, including, but not limited to SrS, ZnS, CaS, PbS, etc.;

Chemoselective materials (see below);

Bioselective materials (see below);

Semiconductors, including, but not limited to Si, Ge, GaAs, CdTe, etc.;

Phosphors, including, but not limited to SrS:Eu, SrS:Ce, ZnS:Ag, $Y_2O_2$:Eu, $Zn_2SiO_4$:Mn, etc. and Transparent conductive oxides, including, but not limited to indium tin oxide, zinc oxide, etc.

For example, if the receiving substrate is a component of an electronic device, the transfer material can be a material having particular desired electronic properties. Examples of electronic materials include metals, dielectrics, ferroelectrics, ferrites, ferrimagnets, ferromagnets, semiconductors, phosphors and electrically conducting organic polymers.

If the receiving substrate is a component of a chemical or biological sensor, the transfer material can be a material that interacts selectively with a particular chemical or biological analyte. Criteria for selecting chemically selective materials for chemical sensing devices are described in detail in McGill et al, "Choosing Polymer Coatings for Chemical Sensors", CHEMTECH, Vol 24, No. 9, pp 27–37 (1994), the disclosure of which is incorporated herein by reference and which states that the chemically selective material may be a polymer with hydrogen bond acidic properties, a polymer with hydrogen bond basic properties, a dipolar polymer, a polarisable polymer, or a nonpolar polymer, depending on the characteristics of the analyte of interest. Examples of chemoselective materials include SXFA (poly(oxy{methyl [4-hydroxy-4,4,bis(trifluoromethyl)but-1-en-1-yl] silylene})), P4V (poly(4-vinylhexafluorocumyl alcohol). Other examples of chemoselective materials include perfluoro-polyethers terminated with a variety of functional groups such as $CF_3CH_2OH$, polyethylene imines, polysiloxanes, alkylamino pyridyl substituted polysiloxanes, polytetrafluoroethylene, polysilanes, polyesters, polyvinylaldehydes, polyisobutylene, polyvinylesters, polyalkenes, zeolites, aerogels, porous carbon, metals, silicalites, clay materials, cellulose materials, polyanilines, polythiophenes, polypyrroles, fullerenes, cyclodextrins, cyclophanes, calixeranes, crown ethers, and organic dyes.

Examples of biochemical materials that can be deposited with the present invention include proteins, oligopeptides, polypeptides, whole cells, biological tissue, enzymes, cofactors, nucleic acids, DNA, RNA, antibodies (intact primary, polyclonal, and monoclonal), antigens, oligosaccharides, polysaccharides, oligonucleotides, lectins, biotin, streptavidin, and lipids.

The receiving substrate may be a component of a physical sensing device, such as, for example, a magnetic sensor, optical sensor, temperature sensor, pressure sensor or gas flow sensor. The transfer material may then be an appropriate sensing material, such as a magnetic sensing material, optical sensing material, temperature sensing material, pressure sensing material or gas flow sensing material. Examples of physical sensing transfer materials include materials that make up individual layers of magnetic-nonmagnetic multi-layers or resonant magnetic oscillators for magnetic sensing, thin film thermocouples for temperature sensing, piezoelectic films or resonators for pressure sensing and simple resistive heater-thermocouple combinations for gas flow sensing.

In many instances, the desired properties of a material are due to the presence of functional groups in the material. For example chemoselective polymers such as SXFA and P4V derive their chemoselectivity from functional groups that extend outward from the polymer backbone. A purpose of the present invention is to provide a way to deposit these polymers onto a substrate without damaging or disrupting the functional groups. As another example, some materials have different electronic, mechanical and thermal properties depending on whether they are in bulk form or in the form of single crystals. For instance, a large grain size is desirable for ferroelectrics to achieve a near bulk dielectric constant and large crystalline platelets are desirable for ferrites to minimize demagnetizing forces. The transfer material in the present invention can be in any form ranging from single crystallites to nanophase powders to micron size particulates, depending on the particular intended use for the transferred material and whether bulk-like properties are desired. A purpose of the present invention is to provide a way to deposit such materials so that the desired form of the material is preserved or even improved (such as in depositing material in such a way that it is better connected or bonded than the original material). Typical particle sizes for the transfer material may range from about 10 nm to about 20 $\mu$m. For close packing of the transfer material, the transfer material can comprise particles of different size classes, so that smaller particles can fit into interstices between larger particles. For example, for face centered cubic packing of particles, the highest packing density can be achieved by providing particles of three different sizes wherein the ratio of particle sizes is 1:less than 0.414:less than 0.225.

The transfer material may also be coated particles, such as metal or ceramic particles coated with organic materials such as organic precursors.

It is the presence of the matrix material that provides the advantages that the present invention has over methods such as laser induced forward transfer (LIFT). The matrix material is selected primarily according to two criteria: the matrix material must be compatible with the transfer material so that the matrix material and the transfer material can be combined into a mixture to form the coating on the front surface of the laser transparent support, and the matrix material must have the property of being more volatile than the transfer material when the coating is exposed to pulsed laser energy so that when the coating is exposed to pulsed laser energy, the matrix material volatilizes or vaporizes, thereby causing the coating to desorb from the surface of the laser transparent support. The amount of matrix material that is used in the coating relative to the amount of the transfer material can be any amount sufficient to accomplish the purposes described above. Typically, the amount will vary according to the particular matrix material and transfer material.

Other factors that can be taken into account in selecting the optimum matrix material to go with a particular transfer material include the ability of the matrix material to dissolve or form a colloidal or particulate suspension with the particular transfer material, the melting point, heat capacity, molecular size, chemical composition, spectral absorption characteristics and heat of vaporization of the matrix material (factors that affect the ability of the matrix material to desorb and lift the transfer material from the target substrate) and the reactivity or nonreactivity of the matrix material towards the transfer material.

The matrix material may also serve other functions. For example, the presence of the matrix material may aid in the construction of the coating on the target substrate by helping to hold the transfer material in place on the target substrate, especially if the transfer material is a powder. At the same time, the matrix material may help prevent the transfer material from binding too tightly to the surface of the target substrate. The matrix material may also provide a source of particle coating for transfer material that is in the form of a powder and provide a source of additives, binders and dispersants for the transfer material.

Another consideration is any special ability a particular matrix material may have to impart protection to a particular transfer material from damage during the lasing, desorption and transfer to the receiving substrate. For example, a matrix material that absorbs laser energy at the same wavelength as an important functional group on the transfer material may serve to protect the transfer material from damage from exposure to the laser energy. Alternatively, a matrix material may be used that absorbs at a wavelength in a spectral region substantially outside that of the transfer material. In this instance, the matrix material transforms pulsed laser energy into kinetic energy, and the kinetic energy is imparted to the transfer material. Examples of matrix materials include but are not limited to addition polymers (see below), condensation polymers (see below), photoresist polymers (see below), water, aryl solvents, especially toluene, acetophenone and nicotinic acid, arene compounds (e.g. naphthalene, anthracene, phenanthrene), t-butylalcohol, halogenated organic solvent, hydrocarbons, ketones, alcohols, ethers, esters, carboxylic acids, phenols and phosphoric acid.

The matrix material may also be a polymer that decomposes or "unzips" into volatile components when exposed to laser energy. The volatile decomposition products then act to propel or lift the transfer material into the gas phase. The polymeric matrix material acts as a propellant and at room temperature the propellant products are volatilized away while the transfer material is deposited as a thin film on the receiving substrate.

Unzipping mechanisms are typically catalyzed by a photon that is absorbed by the polymer and leads to chain cleavage, formation of a free radical (The free radical can be formed either by a thermally driven process or by a photochemical process) in the chain which then travels down the polymer chain leading to a chain unzipping that can produce the monomer species. The monomer, ejected at high kinetic energies, imparts some of this energy to the transfer material mixed with the polymer. One general controlling factor for depolymerization or unzipping of addition polymers is the ceiling temperature of the polymer. At the ceiling temperature, the rates of polymerization and depolymerization are equal. At temperatures above the ceiling temperature, depolymerization dominates polymerization. Laser radiation allows the high ceiling temperatures required for to depolymerization to be reached between radiation pulses.

In general, polymeric propellants that are suitable candidates for consideration as matrix materials are taken from the class of polymers called addition polymers. As a subclass of addition polymers, the suitable candidate materials are typically sterically crowded and are generally thermally unstable. The general polymer classes that are of interest with known properties include poly(alkenes), poly(acrylics), poly(methacrylics), poly(vinyls), poly(vinylketones), poly (styrenes), poly(oxides) or polyethers. In general, addition polymers with alpha substituted structures consistently exhibit lower ceiling temperatures than their unsubstituted parent species and are strong candidate materials. Polymers from the class of materials called condensation polymers, as well as the class of materials called photoresist polymers, may also have some utility, especially if they decompose to volatile materials. The spectrum of candidate materials is wide and many polymers propellants can be used as the matrix material. Not all will be ideal in all characteristics. For example, repolymerization of a polymeric matrix material on the receiving substrate may be a problem with some materials. Other factors to be considered in the selection of the matrix material include the absorption of UV laser radiation, volatility of native propellant material, efficiency of the unzipping process, products of unzipping or decomposition and their volatilty/toxicity, kinetic energy imparted by the propellant, degree of repolymerization, inertness of binder material, inertness of unzipped or decomposed propellant, cost, availability, purity, and processability with the material of interest to be deposited.

Specific polymeric matrix materials include, but are not limited to, the following: polyacrylic acid -butyl ester, nitrocellulose, poly(methacrylic acid)-methyl ester (PMMA), poly(methacrylic acid)-n butyl ester (PBMA), poly(methacrylic acid)-t butyl ester (PtBMA), polytetrafluoroethylene (PTFE), polyperfluoropropylene, poly N-vinyl carbazole, poly(methyl isopropenyl ketone), poly alphamethyl styrene, polyacrylic acid, polyvinylacetate, polyvinylacetate with zincbromide present, poly(oxymethylene), phenol-formaldehyde positive photoresist resins and photobleachable aromatic dyes.

The matrix material may also contain components that assist in the bonding of the transfer material to the receiving substrate or that assist in the bonding of particles of the transfer material to each other after they are deposited on the receiving substrate.

Examples of possible transfer material—matrix material combinations for the transfer of electronic materials include alumina (transfer material) with phosphoric acid (matrix material), barium titanate (transfer material) with poly (methacrylic acid), n-butyl ester (PBMA) (matrix material), yttrium iron garnet (transfer material) with poly(methacrylic acid), n-butyl ester (PBMA) (matrix material), and nickel (transfer material) with KPR, (a phenol-formaldehyde positive photoresist polymer) (matrix material).

Examples of possible transfer material—matrix material combinations for the transfer of chemoselective polymers are SXFA (poly(oxy{methyl[4-hydroxy-4,4,bis (trifluoromethyl)but-1-en-1-yl] silylene})) (transfer material) with t-butanol (matrix material) and P4V (poly(4- vinylhexafluorocumyl alcohol)) (transfer material) with acetophenone (matrix material).

The transfer material and the matrix material may be combined to form the coating on the front surface of the laser transparent support in any manner that is sufficient to carry out the purpose of the invention. If the transfer material is soluble to some extent in the matrix material, the transfer material may be dissolved in the matrix material. Alternatively, if the transfer material is not soluble in a suitable solvent, the transfer material may be mixed with a matrix material to form a colloidal or particulate suspension or condensed phase. Still another alternative is to combine the matrix material and the transfer material with a solvent that volatilizes after the mixture is applied to the laser transparent support. The matrix material can also include soluble or insoluble dopants, that is, additional compounds or materials that one may wish to deposit onto the film.

The mixture of the transfer material and the matrix material may be applied to the front surface of the laser transparent support by any method known in the art for creating uniform coatings on a surface, including, for example, by spin coating, ink jet deposition, jet vapor deposition, spin spray coating, aerosol spray deposition, electrophoretic deposition, pulsed laser deposition, matrix assisted pulsed laser evaporation, thermal evaporation, sol gel deposition, chemical vapor deposition, sedimentation and print screening. Typically, the mixture of the transfer material and the matrix material will be applied to the front surface of the laser transparent substrate to form a coating that is between about 0.1 $\mu$m and about 100 $\mu$m in thickness. Preferably, the coating is greater than about 1 $\mu$m in thickness, and, most preferably, is between about 1 $\mu$m and about 20 $\mu$m in thickness. The thicker the coating, the more of the transfer material can be transferred at one time, which is an advantage of the present invention over laser transfer methods that use thin films. On the other hand, a coating that is too thick will not desorb when exposed to the pulsed laser.

If the mixture of the transfer material and the matrix material is a liquid at room temperature, the mixture may be coated onto the front surface of the laser transparent support and then the mixture may be frozen to form a solid coating. The target substrate may be kept frozen while the coating is being exposed to a source of laser energy during the deposition process.

The laser transparent support is typically planar, having a front surface that is coated with the mixture of the transfer material and the matrix material and a back surface that can be positioned so that laser energy can be directed through the support. The composition of the laser transparent support is selected in accordance with the particular type of pulsed laser that is used. For example, if the laser is a UV laser, the laser transparent support may be a UV-transparent material including, but not limited to fused silica or sapphire. If the laser is an IR laser, the laser transparent support may be an IR-transparent material including, but not limited to plastic, silicon, fused silica, or sapphire. Similarly, if the laser is a visible laser, the laser transparent support may be a material that is transparent in the visible range, including, but not limited to soda-lime and borosilicate glasses.

Any suitable source of laser energy may be used in the present invention. In general, a pulsed laser is preferred. (As used herein, the terms "pulsed laser" and "source of pulsed laser energy" are used interchangeably to refer to any device that creates a pulsed laser beam.) Lasers for use in accordance with the present invention can be any type such as are generally used with other types of laser deposition. Pulsed lasers are commercially available within the full spectral range from UV to IR. Typically, such lasers emit light having a wavelength in the range of about 157 nm–1100 nm, an energy density of about 0.05–10 J/cm$^2$ (typically about 0.1–2.0 J/cm$^2$), a pulsewidth of about $10^{-12}$–$10^{-6}$ second and a pulse repetition frequency of about 0 to greater than 20,000 Hz. In general, energy density (fluence) affects morphology; higher energies tend to produce deposited films that have larger particles. Examples of suitable lasers include, but are not limited to, pulsed gas lasers such as excimer lasers, i.e. $F_2$ (157 nm), ArF (193 nm), KrF (248 nm). XeCl (308 nm), XeF (351 num), $CO_2$, nitrogen, metal vapor, etc., pulsed solid state lasers such as Nd:YAG, Ti:Sapphire, Ruby, diode pumped, semiconductor, etc., and pulsed dye laser systems. Typically, the particular laser is selected with regard to the absorption wavelengths of the matrix material.

The source of pulsed laser energy, the target substrate and the receiving substrate can be positioned with respect to each other and moved with respect to each other by any means known in the art for supporting a laser, target substrate and receiving substrate and moving them in a controlled and defined manner. For example, similar positioning means and moving means for a laser, target and receiving substrate are known in the fields of laser transfer deposition and laser induced forward transfer. The laser may be positioned in any location that provides an optical path between itself and the target substrate so that sufficient laser energy can be directed to defined positions on the target substrate. The dimensions of the pulsed laser beam can be controlled by any means known in the art so that only a precisely defined area of the target substrate is exposed to the pulsed laser energy and so that only a precisely defined portion of the coating desorbs. The receiving substrate should be positioned so that when the coating on the target substrate is desorbed, the transfer material can be deposited at a defined location on the receiving substrate. Also, there should be enough space between the target substrate and the receiving substrate so that volatilized matrix material, or byproducts from laser-induced decomposition of the matrix material, can escape from the space between the target substrate and the receiving substrate. Preferably, the receiving substrate is positioned about 10 to about 100 $\mu$m from the coating on the front surface of the target substrate. The laser, target substrate, and the receiving substrate should be moveable with respect to each other so that the transfer material can be deposited in a pattern and so that after the coating desorbs at one location on the target substrate, the pulsed laser energy can be directed to another location on the target substrate where the coating has not yet desorbed. For example, to deposit a line of material on the receiving substrate, the laser is moved with respect to the target substrate and the receiving substrate, which may be held stationary with respect to each other. As the laser moves with respect to the substrate, it directs laser energy to a new location on the target substrate where the coating has not yet desorbed, and causes the transfer material to be deposited onto a new location on the receiving substrate. The successive locations may overlap to the extent necessary to create a continuous line of material on the receiving substrate. To increase the thickness of a deposit at a particular location, the laser and the receiving substrate are held stationary with respect to each other and the target substrate is moved with respect to the laser and the receiving substrate so that as the target substrate moves with respect to the laser, laser energy is directed to a new location on the target substrate where the coating has not yet desorbed and since the laser and the receiving substrate are not moved with respect to each other, the transfer material is deposited onto the same location on the receiving substrate in an increasingly thickened deposit. (As used herein, the terms "moving [a] with respect to [b]" or "moving [a] and [b] with respect to each other" mean that either [a] or [b] can be moved to effect a change in their relative position.)

The apparatus of the present invention can be adapted so that a plurality of different transfer materials can be deposited consecutively onto a receiving substrate. This may be done by providing a plurality of target substrates each having a different coating with a different transfer material and providing a way to consecutively move each target substrate into a position for depositing material from that target substrate onto the receiving substrate. Consecutive deposition of different transfer materials can also be accomplished by providing a target substrate that is subdivided into a plurality of different subregions that each have a different coating with a different transfer material and providing a way to select a particular subregion and deposit the transfer material from that subregion onto the receiving substrate.

The apparatus of the present invention can also be adapted so that an entire pattern of transfer material is deposited simultaneously on a patterned substrate Having described the invention, the following examples are given to illustrate specific applications of the invention, including the best mode now known to perform the invention. These specific examples are not intended to limit the scope of the invention described in this application.

EXAMPLES

Example 1: Deposition of Alumina ($Al_2O_3$)

The coating for the target substrate for the deposition of alumina was prepared by mixing 2 grams of alumina, in the form of random-shaped powders having an average particle size of 0.3 $\mu$m, with 1 ml of a matrix material, phosphoric acid, in 9 ml of methanol and then applying the solution to one side of a 5 cm diameter fused silica disc by spin coating to form an Al3O3/H3PO4 coating about 1 to 2 $\mu$m thick. Using an excimer pulsed laser operating at 248 nm and at a fluence of 300 mJ/cm$^2$, focused through the fused silica disk to strike the coating in a 25 $\mu$m laser spot, it was possible to transfer the alumina powders from the silica disc to a receiving substrate surface located 25 $\mu$m away. Each laser shot produced a 25 $\mu$m disc-shaped deposit about 1 $\mu$m thick. To create a line of deposited BTO on the substrate, the laser was moved in a line relative to the substrate and the receiving substrate. To increase the thickness of the deposit at a particular location, the laser and the receiving substrate were held stationary to each other for several shots while the target substrate was moved. With this technique, a dielectric layer for a capacitor was formed.

Example 2: Deposition of Barium Titanate ($BaTiO_3$, also referred to as "BTO")

The coating for the target substrate for the deposition of barium titanate was prepared by mixing 1 gram of BTO, in the form of random-shaped powders having an average particle size of 1 $\mu$m, with 0.05 grams of a matrix material, poly(methacrylic acid), n-butyl ester (PBMA) in 10 ml of chloroform and then applying the solution to one side of a 5 cm diameter fused silica disc by spin coating to form a BTO/PBMA coating about 1 to 2 $\mu$m thick. Using an excimer pulsed laser operating at 248 nm and at a fluence of 400 mJ/cm$^2$, focused through the fused silica disk to strike the coating in a 25 $\mu$m laser spot, it was possible to transfer the BTO powders from the silica disc to a receiving substrate surface located 25 $\mu$m away. Each laser shot produced a 25 $\mu$m disc-shaped deposit about 1 $\mu$m thick. To create a line of deposited BTO on the substrate, the laser was moved in a line relative to the substrate and the receiving substrate. To increase the thickness of the deposit at a particular location, the laser and the receiving substrate were held stationary to each other for several shots while the target substrate was moved. With this technique, a dielectric layer for a capacitor was formed.

Example 3: Deposition of Yttrium Iron Garnet ($Y_3Fe_5O_{12}$, also referred to as "YIG")

The coating for the target substrate for the deposition of yttrium iron garnet was prepared by mixing 1 gram of YIG, in the form of spherical powders having an average particle size of 1 $\mu$m, with 0.05 grams of a matrix material, poly (methacrylic acid), n-butyl ester (PBMA) in 10 ml of chloroform and then applying the solution to one side of a 5 cm diameter fused silica disc by spin coating to form a YIG/PBMA coating about 1 to 2 $\mu$m thick. Using an excimer pulsed laser operating at 248 nm and at a fluence of 400 mJ/cm$^2$, focused through the fused silica disk to strike the coating in a 25 $\mu$m laser spot, it was possible to transfer the YIG powders from the silica disc to a receiving substrate surface located 25 $\mu$m away. Each laser shot produced a 25 $\mu$m disc-shaped deposit about 1 $\mu$m thick. To create a line of deposited BTO on the substrate, the laser was moved in a line relative to the substrate and the receiving substrate. To increase the thickness of the deposit at a particular location, the laser and the receiving substrate were held stationary to each other for several shots while the target substrate was moved. With this technique, a ferrite core for an inductor was formed.

Example 4: Deposition of Nickel

The coating for the target substrate for the deposition of nickel was prepared by mixing 2 grams of nickel, in the form of spherical powders having an average particle size of 1 $\mu$m, with 10 ml of a matrix material, diazonaphthoquinone-novolac (a phenol-formaldehyde positive photoresist polymer sold by Kodak under the tradename "KPR") and then applying the solution to one side of a 5 cm diameter fused silica disc by spin coating to form a nickel/KPR coating about 1 to 2 $\mu$m thick. Using an excimer pulsed laser operating at 248 nm and at a fluence of 450 mJ/cm$^2$, focused through the fused silica disk to strike the coating in a 40 $\mu$m laser spot, it was possible to transfer the YIG powders from the silica disc to a receiving substrate surface located 25 $\mu$m away. Each laser shot produced a 40 $\mu$m disc-shaped deposit about 0.3 $\mu$m thick. To create a line of deposited nickel on the substrate, the laser was moved in a line relative to the substrate and the receiving substrate. To increase the thickness of the deposit at a particular location, the laser and the receiving substrate were held stationary to each other for several shots while the target substrate was moved. With this technique, various lines of deposited nickel were formed.

Obviously, many modifications and variations of the present invention are possible in light of the above teachings. It is therefore to be understood that, within the scope of the appended claims, the invention may be practiced otherwise than as specifically described.

What is claimed is:

1. A method for creating a circuit element for an electronic device, the method comprising the steps of
   (a) providing a pulsed laser,
   (b) providing a receiving substrate,
   (c) providing a target substrate comprising a laser-transparent support having a back surface and a front surface, wherein the front surface has a coating that comprises a transfer material and a matrix material, wherein the transfer material comprises particles of electronic material selected from the group consisting of metal particles, dielectric particles, ferroelectric particles, ferrite particles, ferrimagnetic particles, ferromagnetic particles, phosphor particles, superconductor particles and semiconductor particles, wherein the coating is a colloidal or particulate suspension of the particles of the transfer material in the matrix material, and wherein the matrix material has the property of being or becoming more volatile than the transfer material when exposed to pulsed laser energy,
   (c) positioning the pulsed laser in relation to the target substrate and exposing the target substrate to pulsed laser energy from the pulsed laser so that the pulsed laser energy is directed through the back surface of the target substrate and through the laser-transparent support to strike the coating at a defined target location with sufficient energy to volatilize the matrix material at the location, causing the coating to desorb from the location and be lifted from the surface of the support,
   (d) positioning the receiving substrate in a spaced relation to the target substrate so that the particles of the transfer material in the desorbed coating are deposited at a defined receiving location on the receiving substrate, and
   (e) repeating steps (c) and (d) at successive defined target locations and successive defined receiving locations so that the deposited particles of transfer material form a connected deposit of transfer material wherein the transfer material in the deposit is better connected or bonded than was the transfer material in the coating on the laser transparent support and wherein the deposit is patterned to form an electronic circuit element, and
   wherein steps (c), (d) and (e) are carried out at room temperature and atmospheric pressure.

2. The method of claim 1 wherein the particles of the transfer material have a grain size of between about 10 nm and about 20 μm.

3. The method of claim 1 wherein the transfer material is a mixture of particles having different grain sizes and where the size distribution of the particles is selected so that the particles that are deposited in step (d) pack together more closely than do particles having a uniform size.

4. The method of claim 1 wherein the transfer material comprises metal particles coated with organic precursors to metals.

5. The method of claim 1 wherein the transfer material comprises ceramic particles coated with organic precursors to ceramics.

6. The method of claim 1 wherein the coating on the front surface of the target substrate has a thickness of between about 0.1 μm and about 100 μm.

7. The method of claim 1 wherein the coating on the front surface of the target substrate has a thickness of between about 1 μm and about 20 μm.

8. The method of claim 1 wherein the matrix material is selected from the group consisting of water, aryl compounds, arene compounds, halogenated organic compounds, hydrocarbons, ketones, esters, ethers, carboxylic acids, alcohols, phenols and phosphoric acid.

9. The method of claim 1 wherein the matrix material has the property of being a liquid at room temperature and wherein the coating is applied to the front surface of the laser transparent support as a liquid and then is frozen to form a solid coating.

10. The method of claim 1 wherein the matrix material is a material that decomposes into volatile components when exposed to pulsed laser energy.

11. The method of claim 10 wherein the matrix material is an addition polymer.

12. The method of claim 10 wherein the matrix material is selected from the group consisting of poly(alkenes), poly(acrylics), poly(methacrylics), poly(vinyls), poly(vinylketones), poly(styrenes), poly(oxides) and polyethers.

13. The method of claim 10 wherein the matrix material is a poly(methacrylic).

14. The method of claim 10 wherein the matrix material is a poly(vinylketone).

15. The method of claim 10 wherein the matrix material is selected from the group consisting of polyacrylic acid -butyl ester, nitrocellulose, poly(methacrylic acid)-methyl ester (PMMA), poly(methacrylic acid)-n butyl ester (PBMA), poly(methacrylic acid)-t butyl ester (PtBMA), polytetrafluoroethylene (PTFE), polyperfluoropropylene, poly N-vinyl carbazole, poly(methyl isopropenyl ketone), poly alphamethyl styrene, polyacrylic acid, polyvinylacetate, a mixture of polyvinylacetate and zincbromide, poly(oxymethylene), phenol-formaldehyde positive photoresist resins and photobleachable aromatic dyes.

16. The method of claim 1 including the further step of positioning the source of pulsed laser energy with respect to the receiving substrate so that the pulsed laser energy can be directed to strike the receiving substrate whereby the receiving substrate can be pretreated or whereby a transfer material deposited on the substrate can be annealed or etched.

17. A method for creating a sensing element for a device for sensing the presence of a chemical analyte, the method comprising the steps of
   (a) providing a source of pulsed laser energy,
   (b) providing a receiving substrate,
   (c) providing a target substrate comprising a laser-transparent support having a back surface and a front surface, wherein the front surface has a coating that comprises a mixture of a transfer material and a matrix material, wherein the transfer material is a material that selectively interacts with the chemical analyte, and wherein the matrix material has the property of being or becoming more volatile than the transfer material when exposed to pulsed laser energy,
   (c) positioning the source of pulsed laser energy in relation to the target substrate and exposing the target substrate to pulsed laser energy so that the pulsed laser energy is directed through the back surface of the target substrate and through the laser-transparent support to strike the coating at a defined target location with sufficient energy to volatilize the matrix material at the location, causing the coating to desorb from the location and be lifted from the surface of the support,
   (d) positioning the receiving substrate in a spaced relation to the target substrate so that the transfer material in the desorbed coating is deposited at a defined receiving location on the receiving substrate, and (e) repeating steps (c) and (d) at successive defined target locations and successive defined receiving locations so that the transfer material is deposited in a pattern that forms a sensing element of a sensing device, and wherein steps (c), (d) and (e) are carried out at room temperature and atmospheric pressure.

18. The method of claim 17 wherein the transfer material is a chemoselective polymer.

19. The method of claim 17 wherein the transfer material is selected from the group consisting of a polymer with hydrogen bond acidic properties, a polymer with hydrogen bond basic properties, a dipolar polymer, a polarizable polymer, a nonpolar polymer and functionalized nanometal particles.

20. The method of claim 17 wherein the transfer material is poly(oxy{methyl[4-hydroxy-4,4,bis(trifluoromethyl)but-1-en-1-yl] silylene}) (SXFA).

21. The method of claim 17 wherein the transfer material is poly(4-vinylhexafluorocumyl alcohol (P4V).

22. The method of claim 17 wherein the matrix material is selected from the group consisting of water, aryl compounds, arene compounds, halogenated organic compounds, hydrocarbons, ketones, esters, ethers, carboxylic acids, alcohols, phenols and phosphoric acid.

23. The method of claim 17 wherein the matrix material has the property of being a liquid at room temperature and wherein the coating is applied to the front surface of the laser transparent support as a liquid and then is frozen to form a solid coating.

24. The method of claim 17 wherein the matrix material is a material that decomposes into volatile components when exposed to pulsed laser energy.

25. The method of claim 24 wherein the matrix material is an addition polymer.

26. The method of claim 24 wherein the matrix material is selected from the group consisting of poly(alkenes), poly(acrylics), poly(methacrylics), poly(vinyls), poly (vinylketones), poly(styrenes), poly(oxides) and polyethers.

27. The method of claim 24 wherein the matrix material is selected from the group consisting of polyacrylic acid -butyl ester, nitrocellulose, poly(methacrylic acid)-methyl ester (PMMA), poly(methacrylic acid)-n butyl ester (PBMA), poly(methacrylic acid)-t butyl ester (PtBMA), polytetrafluoroethylene (PTFE), polyperfluoropropylene, poly N-vinyl carbazole, poly(methyl isopropenyl ketone), poly alphamethyl styrene, polyacrylic acid, polyvinylacetate, a mixture of polyvinylacetate and zincbromide, poly(oxymethylene), phenol-formaldehyde positive photoresist resins and photobleachable aromatic dyes.

28. A method for creating a sensing element for a device for sensing the presence of a biochemical or biological analyte, the method comprising the steps of (a) providing a source of pulsed laser energy, (b) providing a receiving substrate, (c) providing a target substrate comprising a laser-transparent support having a back surface and a front surface, wherein the front surface has a coating that comprises a mixture of a transfer material and a matrix material, wherein the transfer material is a material that selectively interacts with the biochemical or biological analyte, and wherein the matrix material has the property of being or becoming more volatile than the transfer material when exposed to pulsed laser energy, (c) positioning the source of pulsed laser energy in relation to the target substrate and exposing the target substrate to pulsed laser energy so that the pulsed laser energy is directed through the back surface of the target substrate and through the laser-transparent support to strike the coating at a defined target location with sufficient energy to volatilize the matrix material at the location, causing the coating to desorb from the location and be lifted from the surface of the support, (d) positioning the receiving substrate in a spaced relation to the target substrate so that the transfer material in the desorbed coating is deposited at a defined receiving location on the receiving substrate, and (e) repeating steps (c) and (d) at successive defined target locations and successive defined receiving locations so that the transfer material is deposited in a pattern that forms a sensing element of a sensing device, and wherein steps (c), (d) and (e) are carried out at room temperature and atmospheric pressure.

29. The method of claim 28 wherein the transfer material is selected from the group consisting of proteins, oligopeptides, polypeptides, whole cells, biological tissue, cofactors, nucleic acids, DNA, RNA, antigens, oligosaccharides, polysaccharides, oligonucleotides, lectins, biotin, streptavidin, and lipids.

30. The method of claim 28 wherein the matrix material is selected from the group consisting of water, aryl compounds, arene compounds, halogenated organic compounds, hydrocarbons, ketones, esters, ethers, carboxylic acids, alcohols, phenols and phosphoric acid.

31. The method of claim 28 wherein the matrix material has the property of being a liquid at room temperature and wherein the coating is applied to the front surface of the laser transparent support as a liquid and then is frozen to form a solid coating.

32. The method of claim 28 wherein the matrix material is a material that decomposes into volatile components when exposed to pulsed laser energy.

33. The method of claim 32 wherein the matrix material is an addition polymer.

34. The method of claim 32 wherein the matrix material is is selected from the group consisting of poly(alkenes), poly(acrylics), poly(methacrylics), poly(vinyls), poly (vinylketones), poly(styrenes), poly(oxides) and polyethers.

35. The method of claim 32 wherein the matrix material is selected from the group consisting of polyacrylic acid -butyl ester, nitrocellulose, poly(methacrylic acid)-methyl ester (PMMA), poly(methacrylic acid)-n butyl ester (PBMA), poly(methacrylic acid)-t butyl ester (PtBMA), polytetrafluoroethylene (PTFE), polyperfluoropropylene, poly N-vinyl carbazole, poly(methyl isopropenyl ketone), poly alphamethyl styrene, polyacrylic acid, polyvinylacetate, a mixture of polyvinylacetate and zincbromide, poly(oxymethylene), phenol-formaldehyde positive photoresist resins and photobleachable aromatic dyes.

* * * * *